United States Patent
Grosse et al.

(10) Patent No.: US 11,451,309 B2
(45) Date of Patent: Sep. 20, 2022

(54) APERTURES WITH DYNAMICALLY VARIABLE ELECTROMAGNETIC PROPERTIES

(71) Applicant: RAYTHEON COMPANY, Waltham, MA (US)

(72) Inventors: Kyle L. Grosse, Elk Grove Village, IL (US); Gary A. Frazier, Garland, TX (US); Catherine Trent, Allen, TX (US); Ralph Korenstein, Natick, MA (US)

(73) Assignee: RAYTHEON COMPANY, Waltham, MA (US)

( * ) Notice: Subject to any disclaimer, the term of this patent is extended or adjusted under 35 U.S.C. 154(b) by 503 days.

(21) Appl. No.: 16/537,212

(22) Filed: Aug. 9, 2019

(65) Prior Publication Data
US 2021/0044364 A1  Feb. 11, 2021

(51) Int. Cl.
*H04B 15/02* (2006.01)
*H03H 7/01* (2006.01)
*H03H 9/24* (2006.01)

(52) U.S. Cl.
CPC .......... *H04B 15/02* (2013.01); *H03H 7/0161* (2013.01); *H03H 9/24* (2013.01); *H03H 2007/013* (2013.01); *H03H 2210/02* (2013.01)

(58) Field of Classification Search
CPC ........ H04B 15/02; H03H 7/0161; H03H 9/24; H01Q 1/38; H01Q 15/142
USPC ...................... 343/909, 912, 781 R, 839, 841
See application file for complete search history.

(56) References Cited

U.S. PATENT DOCUMENTS

| | | | |
|---|---|---|---|
| 2,644,065 A | 6/1953 | Peterson | |
| 5,139,850 A | 8/1992 | Clarke et al. | |
| 5,208,603 A | 5/1993 | Yee | |
| 5,619,365 A | 4/1997 | Rhoads et al. | |
| 6,545,500 B1 | 4/2003 | Field | |
| 6,646,605 B2 | 11/2003 | McKinzie, III et al. | |
| 7,173,565 B2 * | 2/2007 | Sievenpiper | H01Q 15/24 343/700 MS |

(Continued)

FOREIGN PATENT DOCUMENTS

| | | |
|---|---|---|
| CN | 107402383 A | 11/2017 |
| CN | 108390134 A | 8/2018 |

(Continued)

OTHER PUBLICATIONS

Shuai Zhao et al: "Electrically triggered dual-band tunable terahertz metamaterial band-pass filter based on Si3N4—VO2—Si3N4 sandwich," Chinese Physics B, (2019) vol. 28, No. 5.

(Continued)

*Primary Examiner* — Hai L Nguyen
(74) *Attorney, Agent, or Firm* — Lando & Anastasi, LLP

(57) ABSTRACT

A dynamic aperture is disclosed. A dynamic aperture includes a base layer, a conductive structure disposed on the base layer, and a layer of a material having a dynamically controllable electrical conductivity that is disposed over the base layer and the conductive structure. A transmission profile of the dynamic aperture is determined by a combination of the conductive structure and the layer of the material. The transmission profile is dynamically alterable by controlling the electrical conductivity of the layer of the material.

11 Claims, 4 Drawing Sheets

(56) References Cited

U.S. PATENT DOCUMENTS

| | | |
|---|---|---|
| 7,592,957 B2 | 9/2009 | Achour et al. |
| 7,611,746 B2 | 11/2009 | Funaki et al. |
| 8,889,218 B2 | 11/2014 | Eberle et al. |
| 9,146,437 B2 | 9/2015 | Driscoll et al. |
| 2005/0012677 A1 | 1/2005 | Brown et al. |
| 2005/0179614 A1 | 8/2005 | Nagy |
| 2009/0096545 A1 | 4/2009 | O'Hara et al. |
| 2010/0168935 A1 | 7/2010 | Rashid et al. |
| 2014/0266517 A1 | 9/2014 | Werner et al. |
| 2017/0082572 A1 | 3/2017 | Jiao et al. |
| 2017/0102601 A1 | 4/2017 | Luten et al. |
| 2017/0273142 A1 | 9/2017 | Denis et al. |
| 2019/0265570 A1 | 8/2019 | Whittingham et al. |

FOREIGN PATENT DOCUMENTS

| | | |
|---|---|---|
| DE | 2551366 A1 | 5/1977 |
| EP | 2916387 A1 | 9/2015 |
| JP | S6242209 A | 2/1987 |

OTHER PUBLICATIONS

Jun-Hwan Shin et al: "Electrically controllable terahertz square-loop metamaterial based on VO2 thin film," Nanotechnology, Institute of Physics Publishing, (2016) vol. 27, No. 19.

D. J. Park et al: "Electrically controllable THz asymmetric split-loop resonator with an outer square loop based on VO2," Optics Express, (2018) vol. 26, No. 13.

Hearn, David R. "Vacuum window optical power induced by temperature gradients", Earth Observing Systems IV (1999), pp. 1-12.

Pilette et al. "Thermal Stresses in Double-Glazed Windows", Canadian Journal of Civil Engineering (1988) vol. 15, No. 5, pp. 807-814.

\* cited by examiner

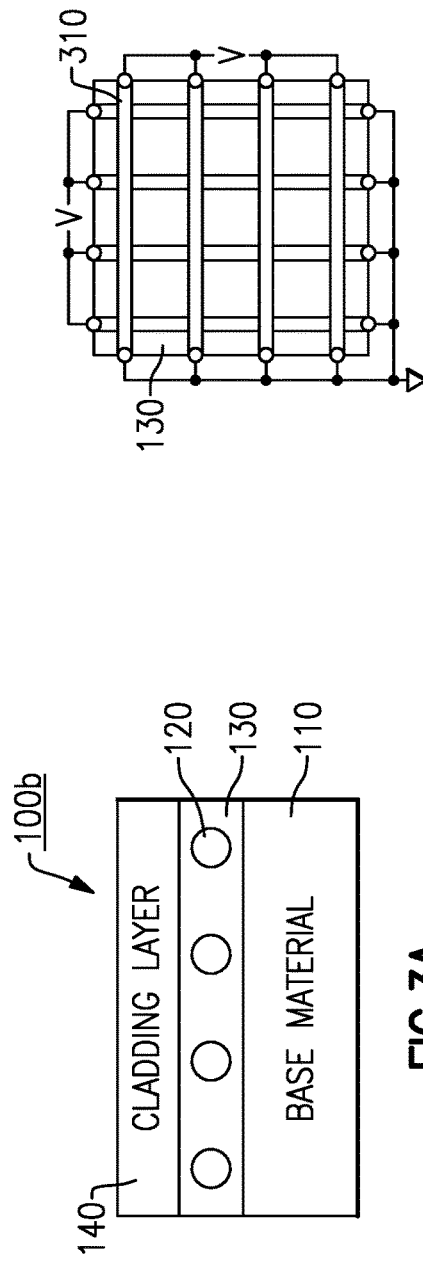
FIG.3A
FIG.3B
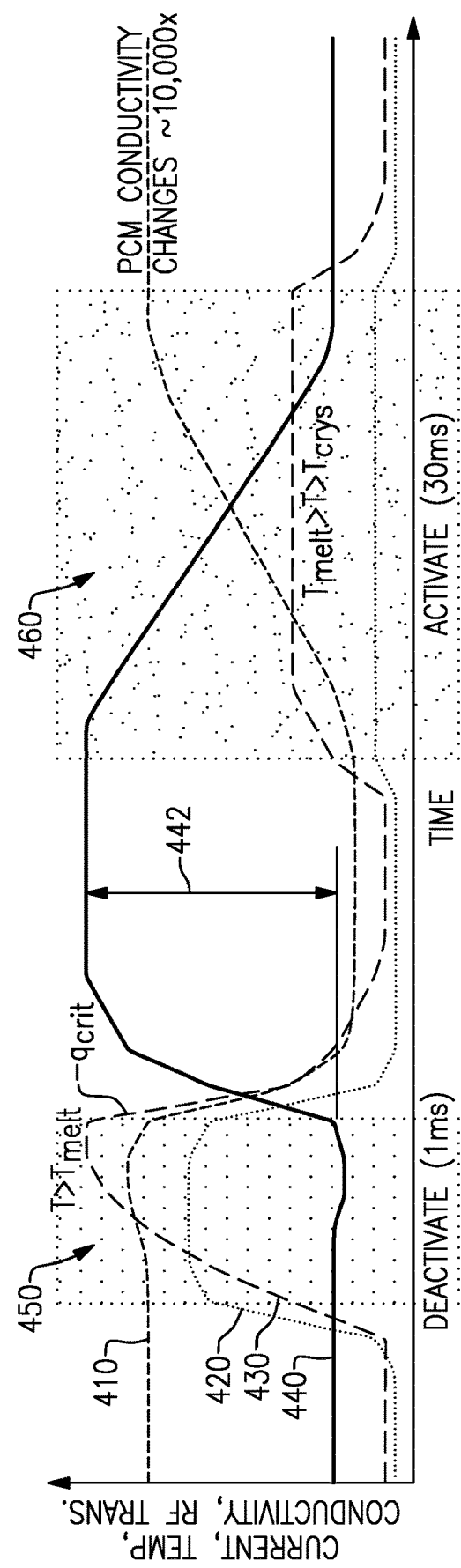
FIG.4

APERTURES WITH DYNAMICALLY VARIABLE ELECTROMAGNETIC PROPERTIES

BACKGROUND

Conventional apertures, whether for radio frequency (RF) or optical applications, have fixed or static structures that cannot be adjusted to address prevalent and dynamic sources of ambient noise. Some attempts to address noise have included modifying the properties or structure of an aperture to create resonances that allow a narrow band of frequencies through the aperture while blocking other signals. For example, notch filters on the aperture surface can be produced by using a metamaterial or frequency selective surface structure. While these notch filters may reject out-of-band noise, ambient noise in the pass-band of the filter is still transmitted through along with the RF signals of interest. The pass-band of the notch filter may be slightly adjustable by changing the dielectric properties of the aperture of the size of the resonance structures, but tuning is limited. In addition, these solutions do not always provide complete RF signal blockage for frequencies outside of the pass-band; the aperture is always subject to some signal leakage.

SUMMARY OF INVENTION

Aspects and embodiments are directed to solving the problem of having an aperture, optical (e.g., infrared) or RF, that has a fixed or static performance. As discussed in more detail below, aspects and embodiments provide an approach that allows for tuning aperture properties so the aperture structure can dynamically react to the noise sources, and describe a method for creating a non-static, dynamic aperture.

A dynamic aperture is disclosed herein. According to aspects and embodiments, a dynamic aperture includes a base layer, a conductive structure disposed on the base layer, and a layer of a material having a dynamically controllable electrical conductivity that is disposed over the base layer and the conductive structure. Aspects and embodiments include a transmission profile of the dynamic aperture being determined by a combination of the conductive structure and the layer of the material, and the transmission profile being dynamically alterable by controlling the electrical conductivity of the layer of the material.

Aspects and embodiments include the material having the dynamically controllable electrical conductivity is a metal-to-insulator transition material.

Aspects and embodiments include that the conductive structure is an electromagnetic interference shield. Aspects and embodiments include that the electromagnetic interference shield includes a plurality of conductive wires arranged in a two-dimensional grid. Aspects and embodiments further a controller configured to apply a control voltage to at least a subset of the plurality of conductive wires to resistively heat the subset of the plurality of conductive wires and thereby heat a surrounding portion of the metal-to-insulator transition material to alter the electrical conductivity of the surrounding portion of the metal-to-insulator transition material.

Aspects and embodiments include that the conductive structure is a frequency selective surface. Aspects and embodiments include that the frequency selective surface is configured to produce a bandpass filter in the transmission profile of the dynamic aperture, and wherein at least one of a range of frequencies included in a passband of the bandpass filter and a level of transmission in the passband of the bandpass filter is adjustable by controlling the electrical conductivity of the metal-to-insulator transition material.

Aspects and embodiments further include a cladding layer disposed over the layer of the material. Aspects and embodiments include that the layer of the material is integrated with an adhesive that bonds the cladding layer and the base layer together.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments and are incorporated in and constitute a part of this specification but are not intended as a definition of the limits of the invention. In the figures, each identical or nearly identical component that is illustrated in various figures is represented by a like numeral. For purposes of clarity, not every component may be labeled in every figure. In the figures:

FIG. 3A is a schematic diagram showing a cross-sectional view of a portion of one example of an aperture according to aspects of the present invention;

FIG. 3B is a schematic diagram showing a plan view of the aperture of FIG. 3A;

FIG. 4 is a graph showing various properties of the aperture of FIGS. 3A and 3B as a function of time;

DETAILED DESCRIPTION

Figure 1:
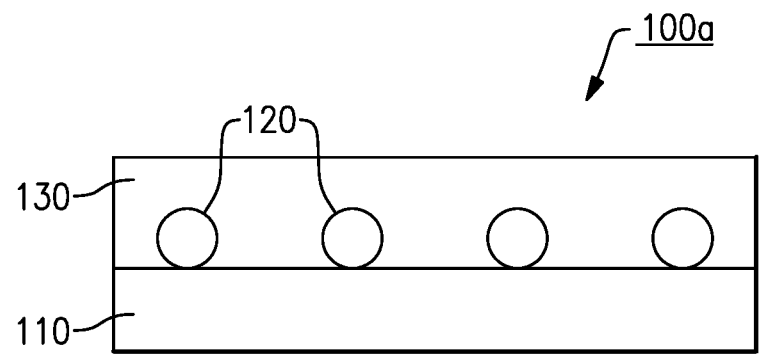
FIG. 1 is a schematic diagram showing a cross-sectional view of a portion of one example of an aperture according to aspects of the present invention.

Optical domes and windows are used in a variety of systems and applications where an optically transparent window in needed, for example, in airborne imaging systems to protect underlying imaging optics from the environment. RF windows and domes are similarly used in various systems and applications. Such optical and RF domes, windows, or similar structures are generally referred to herein as "apertures." As discussed above, resonance-based structures, such as notch filters, are sometimes used to reduce the transmission of unwanted signals through the aperture. However, these notch filters simply carve-out a notch in the spectrum to utilize for all functions and are permanently subject to ambient noise at the selected frequency band.

Aspects and embodiments provide an aperture having the capability to dynamically change its electromagnetic (e.g., RF or optical) performance and thereby adjust to changing noise conditions, varying frequencies of operation, or other system-based or environmental conditions. According to certain embodiments, a metal-to-insulator transition material is introduced into the aperture, and the material can be manipulated to adjust the aperture surface from a dielectric to metallic. This concept creates a broadband and dynamic aperture. As discussed further below, according to certain embodiments, the introduction of the metal-to-insulator transition material allows the aperture to dynamically become either RF transparent or RF blocking, enabling broad-band RF performance for the aperture and reducing the problem of transmission of unwanted RF signals.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Optical and RF apertures for various applications generally include one or more base layers of a material that is substantially transmissive in the frequency band or bands of interest. Various structures or other layers may be incorporated with the one or more base layers. For example, many apertures include an embedded electromagnetic interference (EMI) shield that may include one or more electrically conductive structures, such as a two-dimensional array or grid of conductive wires, for example. As discussed above, certain examples of apertures include a frequency selective surface or other structure to provide a filter. Anti-reflective coatings, cladding layers, or other layers may also be included. According to various aspects and embodiments, an additional material is introduced into any of these aperture structures; specifically, a layer of a material having an electrical conductivity that can be controlled and dynamically altered to alter the electromagnetic properties of the aperture. An example of such a material is a metal-to-insulator transition material, which is a material whose conductivity can be altered to change the material from being dominantly conductive (like certain metals) to being dominantly non-conductive or insulating (e.g., a dielectric). The electrical conductivity of the material may be altered by applying a voltage or current to the material or by changing the temperature of the material. By controlling the conductivity of this layer of material, the aperture can be made more or less transmissive to electromagnetic radiation in one or more frequency bands, thus providing dynamically variable filtering of noise or other unwanted signals.

Figure 2:
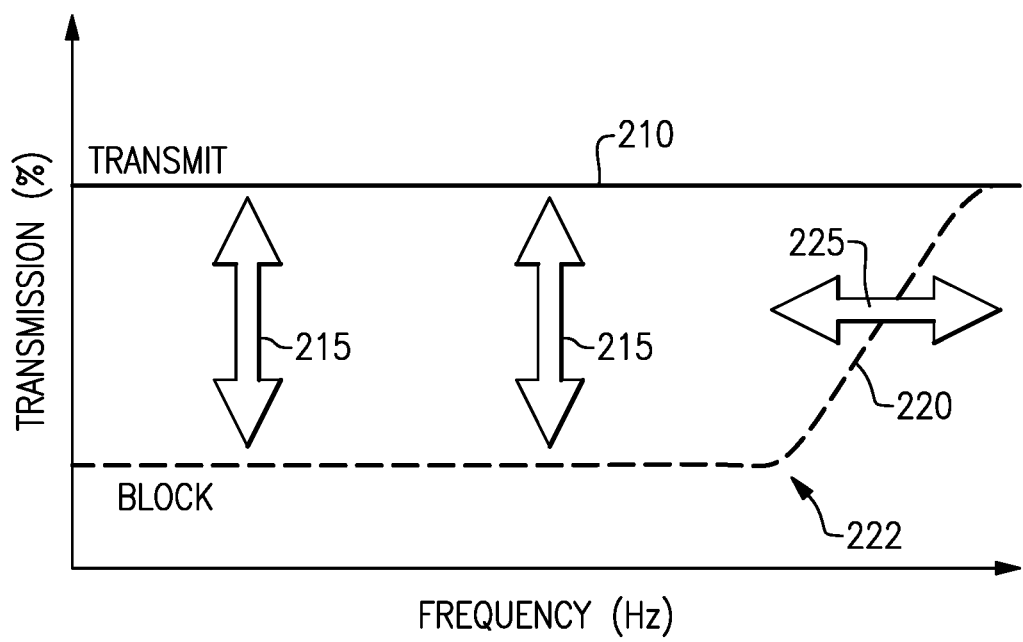
FIG. 2 is a graph showing an example of transmission properties of the aperture of FIG. 1 as a function of frequency.

Referring to FIG. 1, there is illustrated a cross-sectional view of a portion of one example of an aperture 100a that includes a base layer 110 and an embedded EMI shield or conductive structure in the form of a plurality conductive wires 120. The aperture 100a also includes a layer of metal-to-insulator transition material 130 disposed over the base layer 110 and the plurality of conductive wires 120. FIG. 2 is a graph showing an example of the transmission properties of the aperture 100a (vertical axis; transmitted electromagnetic radiation as a percentage of received electromagnetic radiation) as a function of frequency (horizontal axis). Line 210 represents full or maximum transmission of the aperture 100a, which may be 100% or may be lower than 100% due to inherent losses in the aperture 100a. Trace 220 represents the transmission properties of the aperture 100a. As shown, the aperture 100a is blocking (opaque) to electromagnetic radiation at certain frequencies, and becomes more transmissive, up to maximum transmission, at other frequencies. The EMI shield contributes to the transmission (or blocking) properties of the aperture 100a, causing the aperture 100a to block electromagnetic interference at certain frequencies. The metal-to-insulator transition material 130 can be controlled (e.g., through applied voltage, current, or heat, as discussed above), to alter the transmission properties of the aperture 100a. For example, the metal-to-insulator transition material 130 can make the aperture 100a more or less transmissive at certain frequencies. This is represented in FIG. 2 by arrows 215, showing that the trace 220 can be moved up or down, towards higher transmission or lower transmission. In addition, the metal-to-insulator transition material 130 can alter the frequency at which the aperture 100a starts to change from mostly blocking to more transmissive. This is represented in FIG. 2 by arrow 225, indicating that the inflection point 222 may be moved left or right, to lower or higher frequencies. Thus, the transmission properties of the aperture 100a can be dynamically altered, by dynamically changing the control applied to the metal-to-insulator transition material 130, to adjust to block noise at different frequencies and/or to transmit desired signals at different frequencies. This capability is provided by the simple addition of the metal-to-insulator transition material 130 in the aperture structure, which adds only minimal impact to the size, weight, power, and cost (SWaP-C) of the aperture 100a.

In certain embodiments, the EMI shield itself can be leveraged to control the electrical conductivity (or other properties) of the metal-to-insulator transition material 130. This concept is demonstrated with reference to FIGS. 3A, 3B, and 4. FIGS. 3A and 3B schematically illustrate an example of an aperture 100b including an embedded EMI shield 310 and the metal-to-insulator transition material 130 disposed over the base layer 110 and the plurality of conductive wires 120 making up the EMI shield 310, as discussed above. In this example, the aperture 100b also includes a cladding layer 140. FIG. 3B is a plan view, showing the EMI shield 310. In this example, the EMI shield 310 includes a rectangular grid of the conductive wires 120; however, those skilled in the art will appreciate that the EMI shield 310 may have other configurations. FIG. 3A is a cross-sectional view taken between the wires in one dimension of the EMI shield 310, such that only the conductive wires 120 running in the opposite dimension are shown. In certain examples, the metal-to-insulator transition material 130 can be integrated into an adhesive which bonds the base layer 110 and the cladding layer 140 together. Thus, the metal-to-insulator transition material 130 may be easily integrated into existing aperture architectures with minimal impact on SWaP-C.

According to certain examples, a control voltage, V, can be applied to all or to one or more selected conductive wires 120 of the EMI shield 310 to resistively heat the wires, which in turn may heat the metal-to-insulator transition material 130 in the region of the heated wires. Heating the metal-to-insulator transition material 130 may alter its electrical conductivity, thereby changing its transmission properties and the transmission properties of the aperture 100b. This change can be controlled to apply over the whole aperture 100b or one or more selected regions of the aperture 100b by applying the controlled voltages to one or more selected conductive wires 120. By changing the applied control voltages, and the selected wires 120 to which the control voltages are applied, the transmission properties of the aperture 100b can be dynamically and spatially controlled in real time.

FIG. 4 is a graph showing various characteristics of the aperture 100b and the metal-to-insulator transition material 130 over time to illustrate operation of the dynamic aperture 100b. In FIG. 4, trace 410 represents the electrical conductivity of the metal-to-insulator transition material 130, trace 420 represents the current flowing through the conductive wires 120 of the EMI shield 310, trace 430 represents the temperature of the metal-to-insulator transition material 130, and trace 440 represents the RF transmission of the aperture 100b. As discussed above, one or more control voltages can be applied to some or all of the conductive wires 120 of the EMI shield 310, causing a current to flow through the wires 120 and heat them. The current flow and associated heating of the wires 120 causes the surrounding metal-to-insulator transition material 130 to heat, as shown by traces 420 and 430 in FIG. 4. The control voltage may be applied as a pulse, which in the illustrated example is a 1 millisecond (ms) pulse 450. The voltage applied and the duration of the pulse 450 may be selected to achieve a particular temperature rise in the metal-to-insulator transition material 130. In the example shown in FIG. 4, the temperature of the metal-to-insulator transition material 130 is raised to above a crystal melting temperature of the material (T>$T_{melt}$) so as to change its material properties. At the end of the applied control voltage pulse 450, the current in the wires 120 is reduced, and the heated region of the metal-to-insulator transition material 130 cools, as shown by the drops in traces 420 and 430. Correspondingly, the electrical conductivity of the metal-to-insulator transition material 130 decreases, as shown by trace 410, and the RF transmission of the aperture 100b (trace 440) increases; i.e., the aperture 100b becomes more transmissive at the given frequency. The increase in RF transmission of the aperture 100b is indicated by dimension 442, and in certain examples, may be as much as 12-15 dB.

As shown in FIG. 4, the RF transmission of the aperture 100b can be returned to the original, or "steady state," condition by applying another control voltage pulse to the EMI shield 310. In the illustrated example, this second pulse 460 is longer (30 ms in the example shown) and of lower intensity, that is, the current flow caused by the second control voltage pulse 460 is significantly lower than that caused by the first control voltage pulse 450, as may be seen with reference to trace 420. Accordingly, due to the lower current, the temperature of the metal-to-insulator transition material 130 increases, but not as much and may be maintained below the melting temperature ($T_{melt}$>T>$T_{crys}$). With the rise in temperature, the electrical conductivity of the metal-to-insulator transition material 130 increases (shown by trace 410) and the RF transmission of the aperture 100b decreases until reaching the original, steady-state value, as shown by trace 440. At this point, the second control voltage pulse 460 may end. In certain example, the change in electrical conductivity of the metal-to-insulator transition material 130 may be as much as 10,000 times. The process illustrated in FIG. 4 may be repeated, optionally with variations in the levels of the control voltages applied, the duration of either or both control pulses 450, 460, and/or the selected conductive wires 120 to which the control voltages are applied, to dynamically control the RF transmission of the aperture 100b.

Figure 5:
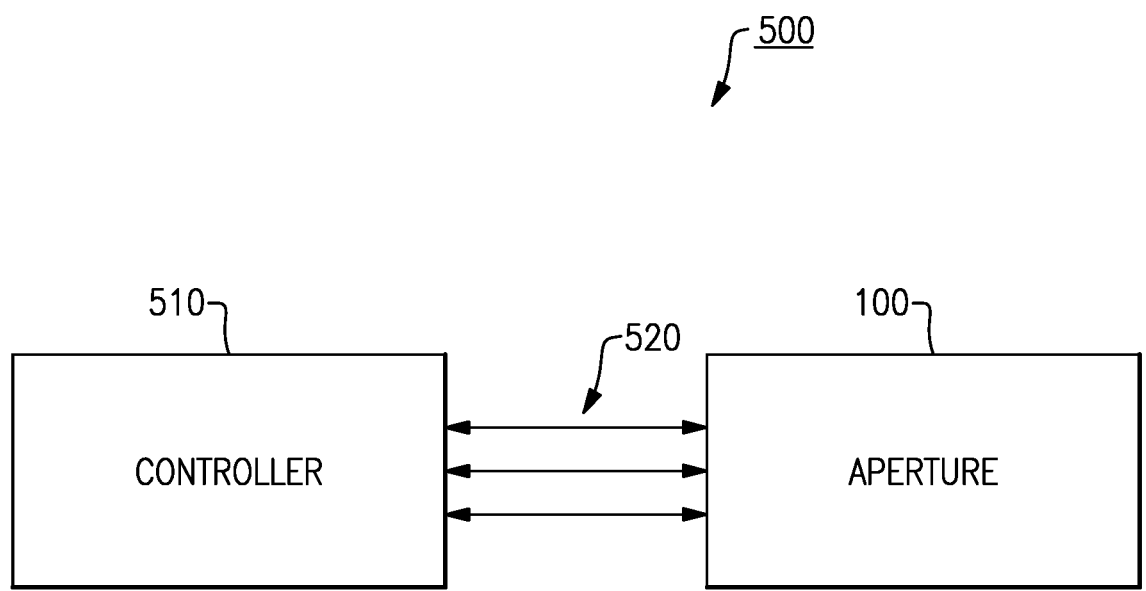
FIG. 5 is a block diagram of one example of a system including a controller and a dynamic aperture according to aspects of the present invention.

As discussed above, individual ones or groups of the conductive wires 120 of the EMI shield 310 can be selectively biased with control voltages to control the temperature of the metal-to-insulator transition material 130 and the transmission properties of the apertures 100a, 100b. Accordingly, referring to FIG. 5, a system 500, such as an optical imaging system or RF system, (e.g., radar or RF communications) may include a aperture 100 and a controller 510 coupled to the aperture 100. The controller 510 may apply individually controllable bias voltages to the EMI shield 310 via one or more control lines 520. The controller 510 may include various electronic components, as would be understood by those skilled in the art, to perform the functionality of applying control voltage (and/or current) to the EMI shield 310, as discussed above, to achieve spatially localized and dynamic control of the transmission properties of the aperture 100. The controller 510 may be a dedicated controller associated with the aperture 100 or may be part of electronics included in the underlying optical or RF system with which the aperture 100 is used.

Figure 6:
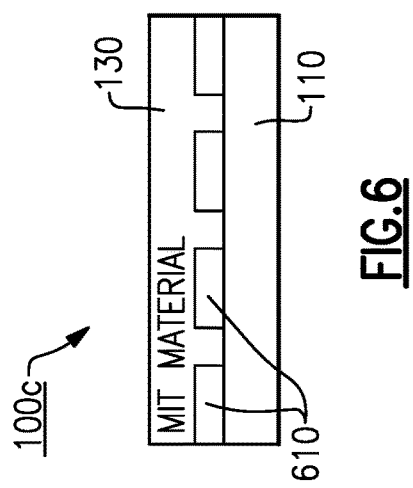
FIG. 6 is a schematic diagram showing a cross-sectional view of a portion of another example of an aperture according to aspects of the present invention.

In the examples discussed above, the apertures 100a, 100b include an embedded EMI shield 310 that can be leveraged to adjust the properties of the metal-to-insulator material 130. However, as discussed above, in other examples, apertures may include other embedded structures, such as a frequency selective surface, for example. Accordingly, in other examples, these other structures can be used in combination with the metal-to-insulator transition material 130 to adjust the transmission properties of the aperture, and optionally can also be leveraged to control the conductivity of the metal-to-insulator transition material 130. For example, referring to FIG. 6 there is illustrated an example of an aperture 100c that includes a frequency selective surface 610 along with the metal-to-insulator transition material 130 positioned over the base layer 110. In the example shown in FIG. 6, the frequency selective surface 610 include a plurality of discontinuous regions, which may be conductive. The plurality of discontinuous regions of the frequency selective surface 610 may have a variety of different shapes, including, for example, squares, rectangles, circles, rings, crosses (e.g. + shape), Y shapes, star shapes, or other geometric or non-geometric shapes. As discussed above, the frequency selective surface 610 may be configured to provide filtering of certain frequencies, for example, to produce a notch or bandpass filter within the aperture 100c. According to certain embodiments, the metal-to-insulator transition material 130 can be controlled (e.g., via voltage, current, or temperature, as discussed above) to operate in combination with the frequency selective surface 610 to vary the filtering (transmission) properties of the aperture 100c.

Figure 7A:
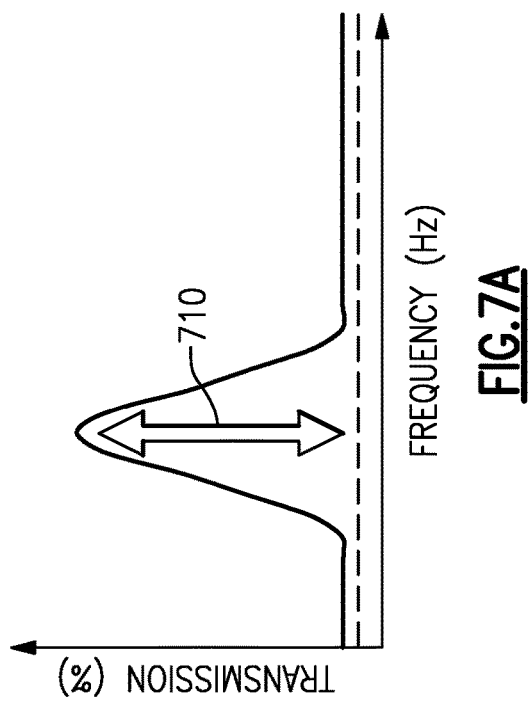
FIG. 7A is a graph showing an example of the transmission characteristics of the aperture of FIG. 6 as a function of frequency.
Figure 7B:
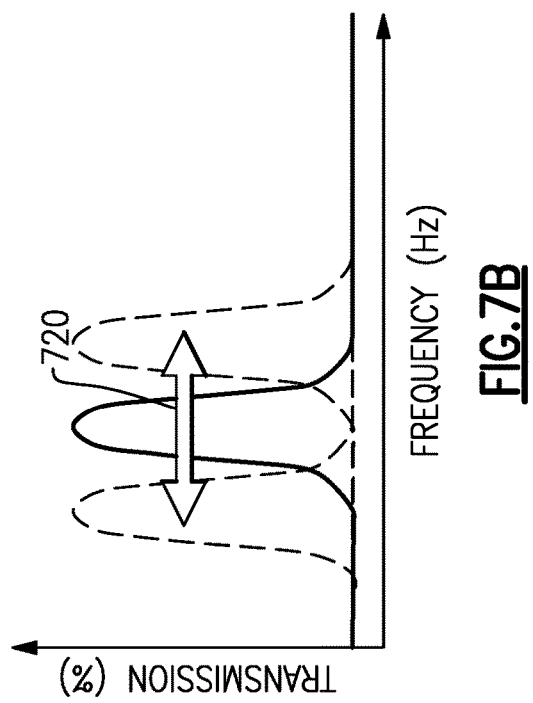
FIG. 7B is a graph showing another example of the transmission characteristics of the aperture of FIG. 6 as a function of frequency.

FIGS. 7A and 7B are graphs showing examples of a transmission profile of the aperture 100c, including a bandpass filter at least partially produced by the frequency selective surface 610. In certain examples, the metal-to-insulator transition material 130 can be used to vary the degree of transmission in the passband of the filter, as indicated by arrow 710 in FIG. 7A. In further examples, the metal-to-insulator transition material 130 can be used to alter the range of frequencies corresponding to the passband of the filter, as indicated by arrow 720 in FIG. 7B. Thus, the amount of transmission and/or the frequency range of transmission of the aperture 100c can be dynamically controlled using the combination of the frequency selective surface 610 and the metal-to-insulator transition material 130.

Thus, aspects and embodiments provide methods and apparatus to dynamically alter RF or optical transmission properties of an aperture that include integration of materials which exhibit an electrical metal-to-insulator transition due to changes in temperature into an aperture, integration of a heater structure into the material or aperture, driving the heater to heat the metal-to-insulator material to induce a change in the electrical conductivity of the metal-to-insulator material, and using that change in electrical conductivity of the metal-to-insulator transition material to alter the transmission properties of the aperture. As discussed above, the metal-to-insulator transition material may be integrated into existing aperture architectures with minimal impact on SWaP-C, and may be operated in combination with other existing structures in the aperture, such as EMI shields and frequency selective surfaces or other filtering structures. The approach disclosed herein provides a dynamic aperture that may exhibit improved noise performance relative to conventional static apertures.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A dynamic aperture comprising:
   a base layer;
   a conductive structure disposed on the base layer; and
   a layer of a metal-to-insulator transition material having a dynamically controllable electrical conductivity, the layer of the material being disposed over the base layer and the conductive structure, a transmission profile of the dynamic aperture being determined by a combination of the conductive structure and the layer of the material, and the transmission profile being dynamically alterable by controlling the electrical conductivity of the layer of the material.

2. The dynamic aperture of claim 1 wherein the conductive structure is an electromagnetic interference shield.

3. The dynamic aperture of claim 2 wherein the electromagnetic interference shield includes a plurality of conductive wires arranged in a two-dimensional grid.

4. The dynamic aperture of claim 3 further comprising a controller configured to apply a control voltage to at least a subset of the plurality of conductive wires to resistively heat the subset of the plurality of conductive wires and thereby heat a surrounding portion of the metal-to-insulator transition material to alter the electrical conductivity of the surrounding portion of the metal-to-insulator transition material.

5. The dynamic aperture of claim 1 wherein the conductive structure is a frequency selective surface.

6. The dynamic aperture of claim 5 wherein the frequency selective surface is configured to produce a bandpass filter in the transmission profile of the dynamic aperture, and wherein at least one of a range of frequencies included in a passband of the bandpass filter and a level of transmission in the passband of the bandpass filter is adjustable by controlling the electrical conductivity of the metal-to-insulator transition material.

7. The dynamic aperture of claim 1 further comprising a cladding layer disposed over the layer of the material.

8. The dynamic aperture of claim 7 wherein the layer of the material is integrated with an adhesive that bonds the cladding layer and the base layer together.

9. A dynamic aperture comprising:
   a base layer;
   a conductive structure disposed on the base layer; and
   a layer of a material having a dynamically controllable electrical conductivity, the layer of the material being disposed over the base layer and the conductive structure, a transmission profile of the dynamic aperture being determined by a combination of the conductive structure and the layer of the material, and the transmission profile being dynamically alterable by controlling the electrical conductivity of the layer of the material, wherein the conductive structure is an electromagnetic interference shield that includes a plurality of conductive wires arranged in a two-dimensional and overlapping grid.

10. The dynamic aperture of claim 9 wherein the material having the dynamically controllable electrical conductivity is a metal-to-insulator transition material.

11. The dynamic aperture of claim 9 wherein the conductive structure is a frequency selective surface.

* * * * *